(12) United States Patent
Richardson (10) Patent No.: US 7,215,185 B2
(45) Date of Patent: May 8, 2007

(54) THRESHOLD VOLTAGE EXTRACTION FOR PRODUCING A RAMP SIGNAL WITH REDUCED PROCESS SENSITIVITY

(75) Inventor: Donald Cook Richardson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 11/138,946

(22) Filed: May 26, 2005

(65) Prior Publication Data

US 2006/0267674 A1 Nov. 30, 2006

(51) Int. Cl.
*G05F 1/10* (2006.01)

(52) U.S. Cl. ...................... 327/541; 327/538

(58) Field of Classification Search ........ 327/131–132, 327/3, 538–543; 323/315, 316
See application file for complete search history.

(56) References Cited

U.S. PATENT DOCUMENTS

| | | | | |
|---|---|---|---|---|
| 5,672,960 A | * | 9/1997 | Manaresi et al. | 323/313 |
| 5,747,978 A | * | 5/1998 | Gariboldi et al. | 323/313 |
| 5,952,874 A | * | 9/1999 | Manaresi et al. | 327/541 |
| 6,091,286 A | | 7/2000 | Blauschild | |
| 6,633,193 B1 | * | 10/2003 | Halamik et al. | 327/334 |
| 6,806,762 B2 | * | 10/2004 | Stair et al. | 327/538 |
| 6,819,154 B2 | * | 11/2004 | Greenfeld | 327/172 |
| 6,838,916 B2 | * | 1/2005 | Premont et al. | 327/132 |
| 6,844,772 B2 | * | 1/2005 | Hoon et al. | 327/541 |

OTHER PUBLICATIONS

Blauschild, Ronald A., "An Integrated Time Reference", ISSCC94, Session 3, Analog Techniques, Paper WP 3.5, IEEE, Jul. 1994, pp. 56-57.

* cited by examiner

*Primary Examiner*—Dinh T. Le
(74) *Attorney, Agent, or Firm*—William B Kempler; W. James Brady; Frederick J. Telecky, Jr.

(57) ABSTRACT

A system for providing a threshold voltage ($V_T$) includes a $V_T$ extractor that extracts the $V_T$ for a MOS transistor relative to a first voltage rail. An inversion circuit inverts the extracted $V_T$ (e.g., $V_T + V_{IN}$) relative to a reference voltage that is intermediate the first voltage rail and a second voltage rail and provides an output corresponding to the $V_T$ (e.g., $V_T + V_{IN}$) relative to the second voltage rail. The relative voltages at the voltage rails generally will depend on whether the $V_T$ is being extracted for a p-channel MOS transistor or an n-channel MOS transistor. The $V_T$ can be employed to generate a ramp voltage across a capacitor formed of another MOS transistor.

21 Claims, 3 Drawing Sheets

THRESHOLD VOLTAGE EXTRACTION FOR PRODUCING A RAMP SIGNAL WITH REDUCED PROCESS SENSITIVITY

BACKGROUND

Metal Oxide Semiconductor Field Effect Transistors (MOSFETs) are often used to implement a variety of analog functions and digital logic. For instance, MOSFETs can be arranged to form of large scale integrated circuits (LSI) and very large scale integrated circuits (VLSI). A MOSFET can be controlled to provide an output that varies as a function of one or more operating parameters. The drain current ($I_D$) through a given MOSFET device can be expressed as follows:

$$I_D = \left(\frac{W}{L}\right)\frac{1}{2}\mu C_{OX}(V_{GS} - V_T)^2$$

where:
W=channel width of the MOSFET;
L=channel length of the MOSFET;
$C_{OX}$=capacitance per unit area of the gate-to-channel capacitor for which the oxide layer serves as a dielectric; and
$V_{GS}$=gate-to-source voltage of the MOSFET.

Of particular interest from the foregoing equation is the threshold voltage ($V_T$). $V_T$ corresponds to a voltage applied to the gate of a field effect transistor (FET) that is necessary to open a conductive channel between the source and drain. More specifically, for the case of a MOSFET, $V_T$ is the minimum voltage at the gate that is necessary for an inversion layer to be formed at the semiconductor surface so that significant current flows through the device. For many integrated N-channel MOSFET devices, $V_T$ is in the range of about 0.3 to 1.5 V.

Various approaches have been developed to determine or extract $V_T$ for a MOSFET. One approach to extract $V_T$ is to obtain $V_T$ from a single voltage measurement. The efficacy of this method generally depends on the selected current, as different drain currents tend to result in different threshold voltages. Another approach is a linear extrapolation method in which a maximum transconductance is employed to locate a point of maximum slope along a plot of drain current versus gate-source voltage. However, the transconductance is dependent on the series resistance of the MOSFET, which can introduce errors. Other approaches to derive an indication of $V_T$ include a ratio method and a quasi-constant-current method, which have various limitations in addition to their complexities.

The extracted $V_T$ can be utilized for a variety of purposes where it is desirable to reduce process-dependent parameters associated with a MOSFET. Examples for using an extracted value of $V_T$ include process monitoring, device characterization, temperature sensing, and voltage reference generation.

SUMMARY

The present invention relates to threshold voltage extraction and producing a ramp signal with reduced process sensitivities. The ramp signal can also be employed to provide an oscillating output signal that is substantially independent of many metal oxide semiconductor (MOS) transistor parameters.

One aspect of the present invention provides a system for providing a threshold voltage ($V_T$). The system includes a $V_T$ extractor that extracts the $V_T$ for a MOS transistor relative to a first voltage rail. An inversion circuit inverts the extracted $V_T$ relative to a reference voltage that is intermediate the first voltage rail and a second voltage rail and provides an output corresponding to the $V_T$ relative to the second voltage rail. The relative voltages at the voltage rails generally will depend on whether the $V_T$ is being extracted for a p-channel MOS transistor or an n-channel MOS transistor.

Another aspect of the present invention relates to system for generating a ramp signal that is substantially independent of threshold voltage parameters. The system includes a $V_T$ extractor that extracts the $V_T$ for a first MOS transistor and provides the $V_T$ relative to a first voltage rail. An inversion and summation network that receives the $V_T$ relative to the first voltage rail and inverts a summation of the $V_T$ and an input signal ($V_{IN}$) relative to a reference voltage that is intermediate the first voltage rail and a second voltage rail. The inversion and summation network provides an output corresponding to summation of the $V_T$ and the input signal $V_{IN}$ relative to the second voltage rail. The summation of the $V_T$ and the input signal $V_{IN}$ can be represented as $$V_T + \frac{V_{IN}}{K},$$

where K is a positive real number defined by circuit parameters of the inversion and summation network. A second MOS transistor, configured as a capacitor having a gate capacitance, is connected between the second voltage rail and an output. A third MOS transistor generates a drain current in response to the summation of the $V_T$ and an input signal $V_{IN}$. The drain current of the third MOS transistor (or a proportional copy of such current) is applied to the capacitor such that the capacitor provides a corresponding ramp signal at the output. The drain current of the third MOS transistor can be mirrored to an oscillator that operates to repeatedly charge and discharge the capacitor (corresponding to the second MOS transistor) to provide an oscillating output signal.

DETAILED DESCRIPTION

The present invention relates to extraction of the threshold voltage ($V_T$) of a metal oxide semiconductor (MOS) transistor, such as an N-channel or a p-channel MOS field effect transistor (MOSFET). The extracted $V_T$ can be employed to generate current through another MOS transistor. This current or a proportional copy of such current can be applied to a capacitive load, which is formed as a MOS gate capacitance from the same type of MOS transistor for which the $V_T$ has been extracted. The MOS capacitor integrates the current to provide a corresponding voltage ramp signal. The relationship between the current through the MOS transistor and the MOS gate capacitance causes the voltage ramp signal to be substantially independent of certain MOS process-dependent MOS transistor parameters. The voltage ramp signal can be employed to implement a voltage controlled oscillator having reduced sensitivity to process variations.

Figure 1:
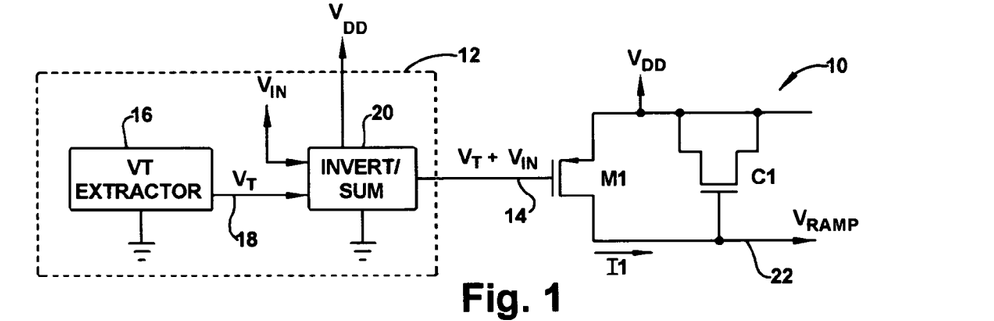
FIG. 1 depicts a block diagram of a ramp generator according to an aspect of the present invention.

FIG. 1 depicts a high-level view of a system 10 that can be implemented to generate a corresponding voltage ramp signal $V_{RAMP}$. The system 10 includes a $V_T$ extraction and normalization circuit 12 that provides an output voltage at 14 corresponding to $V_T+V_{IN}$ relative to a first voltage rail, indicated at $V_{DD}$. That is, the voltage potential between $V_{DD}$ and the output 14 is equal to $V_T+V_{IN}$.

The extraction and normalization circuit 12 includes a $V_T$ extractor 16 that extracts $V_T$ for an associated MOS transistor (not shown) and provides an output at 18 corresponding to $V_T$ relative to a second voltage rail, such as electrical ground. That is, the voltage potential between electrical ground (or other low voltage rail) and the output 18 is equal to $V_T$. An inversion/summing circuit 20 receives $V_T$ and an input voltage $V_{IN}$ as inputs. The inversion/summing circuit 20 is configured to sum together the inputs $V_T$ and an input voltage $V_{IN}$ and to invert the sum relative to a voltage that is intermediate $V_{DD}$ and electrical ground. The inversion/summing circuit 20 then provides the output voltage at 14 corresponding to the summation of $V_T+V_{IN}$, which is provided relative to $V_{DD}$. The proportion of the $V_{IN}$ component in the output voltage at 14 can be controlled according to circuit parameters implemented in the inversion/summing circuit 20 (e.g., output at 14 can equal $$V_T + \frac{V_{IN}}{K},$$

where K is a positive real number defined by circuit parameters).

An output stage includes a MOS transistor M1 coupled between $V_{DD}$ and an output node 22 at which $V_{RAMP}$ is provided. The output $V_T+V_{IN}$ is provided to the gate of the MOS transistor M1. Since the MOS transistor M1 is the same type of MOS transistor as employed in the $V_T$ extractor 16, current through the MOS transistor M1, indicated at I1, varies as a function of the input voltage $V_{IN}$. A capacitor C1 is coupled in parallel with M1 between $V_{DD}$ and the output node 22. The capacitor C1 is configured as the gate capacitance of another MOS transistor by shorting the source and drain of the transistor to $V_{DD}$. By supplying $V_T+V_{IN}$ to the gate of M1, the capacitor integrates the current I1 to provide the ramp signal V at 22.

As an example, assuming that M1 is a P-channel MOSFET, M1 provides the current I1, which can be expressed as follows:

$$I1 = \left(\frac{W}{L}\right)_1 \frac{1}{2} \mu C_{OX}(V_{GS} - V_T)^2 \qquad \text{Eq. 1}$$

where:

$\left(\frac{W}{L}\right)_1$ = ratio of channel width and length of the M1;

$C_{OX}$=capacitance per unit area of the gate-to-channel capacitor for which the oxide layer serves as a dielectric; and $V_{GS}$=gate-to-source voltage of the M1.

Since the extraction and normalization circuit 12 provides $V_T+V_{IN}$ relative to $V_{DD}$, the gate-to-source voltage of M1 is equal to $V_{GS}=V_{IN}+V_T$. Substituting $V_{IN}+V_T$ into Eq. 1, the current I1 reduces to:

$$I1 = \left(\frac{W}{L}\right)_1 \frac{1}{2} \mu C_{OX}(V_{IN})^2 \qquad \text{Eq. 2}$$

As mentioned above, the capacitor C1 is driven by the current I1 that is inducted in the MOS transistor M1 so that a corresponding ramp signal $V_{RAMP}$ is generated. The capacitance C1, being gate capacitance of a MOS transistor, can be described as follows:

$$C1 = (W \cdot L)_2 \cdot C_{OX} \qquad \text{Eq. 3}$$

where:

$(W \cdot L)_2$=product of channel width and length of C1; and $C_{OX}$=capacitance per unit area of the gate-to-channel capacitor for which the oxide layer serves as a dielectric.

The ramp signal $V_{RAMP}$ experiences a rate of change in capacitor voltage with respect to time $$\frac{dV_C}{dt}$$

that can be described from combing Eqs. 2 and 3 as follows:

$$\frac{dV_C}{dt} = \frac{I1}{C1} = \left(\frac{W}{L}\right)_1 \frac{\mu(V_{IN})^2}{2(W \cdot L)_2} \qquad \text{Eq. 4}$$

From Eq. 3, it is shown that $$\frac{dV_C}{dt}$$

varies quadratically as a function of $V_{IN}$. Thus, $$\frac{dV_C}{dt}$$

of $V_{RAMP}$ can be controlled by changing $V_{IN}$ accordingly. Since the current that is used to drive the capacitor is derived from $C_{OX}$ and the capacitor is implemented as a MOSFET device having the same $C_{OX}$ characteristics, process sensitivity in the resulting ramp signal can be mitigated. Additionally, the summation of $V_T$ and $V_{IN}$ at the gate of M1 mitigates the effects of $V_T$ variation.

Figure 2:
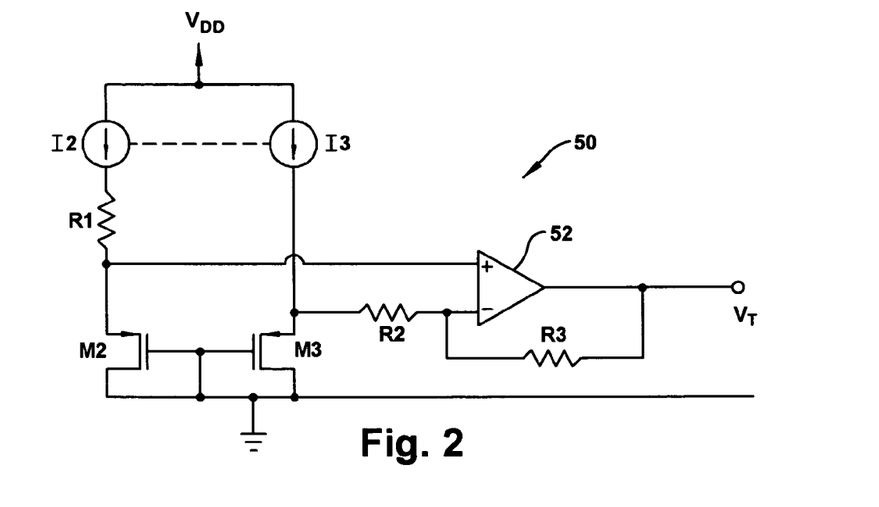
FIG. 2 depicts an example circuit for extracting a threshold voltage according to an aspect of the present invention.

FIG. 2 depicts and example of a circuit 50 that can be utilized to extract $V_T$ for a MOS transistor according to an aspect of the present invention. While for purposes of explanation only, and not by way of limitation, the circuit 50 is configured to extract $V_T$ for a p-channel MOS transistor. It is to be understood and appreciated that the approach described with respect to FIG. 2 is equally applicable to other types of MOS transistors, including N-channel devices.

The circuit 50 includes a pair of MOS transistors M2 and M3 connected with their gates and drains connected together. A first current source I2 provides substantially fixed current through a resistor R1 through M2. A second current source I3 provides substantially fixed current to M3. As an example, the currents I2 and I3 can be generated via a current mirror network (schematically depicted as a dashed line interconnecting the current sources) such that I3 is proportional to I2 (e.g., I3=2*I2). Accordingly, the current through M2 is equal to the current through M1.

The node between R1 and M1 is provided to a non-inverting input of an operational amplifier (op-amp) 52. The inverting input of the op-amp 52 is connected to the source of M3 through a resistor R2. Negative feedback for the amplifier circuit is provided by connecting a resistor R3 between an output of the op-amp 52 and the inverting input.

The arrangement of FIG. 2 can be designed to generate a voltage corresponding to the difference between $V_{GS3}$ and $V_{GS2}$, which difference can be referred to as a delta-$V_{GS}$. By way of example, the transistor M2 can be configured to have a ratio of width to length $(W/L)_2$ that is larger than the ratio of width to length $(W/L)_3$ of M3; (e.g., $(W/L)_2=4*(W/L)_3$). As a result, because $(V_{GS}-V_T)$ varies as the square root of current density, if $V_{GS2}=V_T+V_X$, then $V_{GS3}=V_T+2*V_X$. In this case, the difference between $V_{GS3}$ and $V_{GS2}$ (the delta-$V_{GS}$) appears across R1 and determines the currents in M2 and M3.

By this arrangement, the op-amp 52 is used with resistors R2 and R3 in an inverting amplifier so that, at its output, $V_{GS3}$ is inverted relative to $V_{GS2}$. As a result of such inversion, the output voltage ($V_{OUT}$) of the op-amp 52 can be expressed as follows:

$$V_{OUT} = V_{GS2} - (V_{GS3} - V_{GS2}), \text{ which further reduces to:}$$
$$= 2*V_{GS2} - V_{GS3} \text{ and by substituting the relationship of}$$
$$V_{GS2} = V_T + V_x,$$

and $V_{GS3}=V_T+2*V_X$, as described above, the output voltage further reduces to:

$$=2*(V_T+V_x)-(V_T+2*V_x)=V_T.$$

Thus, by the arrangement of FIG. 2, the currents in the transistors M2 and M3 can be made equal by operation of the current mirror, the resistors R1, R2 and R3 and the op-amp. Those skilled in the art will understand and appreciate that other approaches could be utilized for generating a delta-$V_{GS}$ value from that shown and described with respect to FIG. 2. Regardless of the implementation of the delta-$V_{GS}$ circuitry, circuit parameters of the system 10 can be adjusted to extract a value for $V_T$. For instance, parameters of the current mirror ratio, the ratio between resistors R1 and R2 and the ratio between resistors R2 and R3 can be adjusted accordingly.

The extracted value of $V_T$ can be utilized in a variety of applications to mitigate process sensitivities. The $V_T$ extraction circuit of FIG. 2 can further be configured to compensate for secondary effects associated with operation of M2 and M3. That is, each of M2 and M3 may not exactly follow the relationship of Eq. 1. Accordingly, these secondary effects can be mitigated by adjusting the ratio of R3 to R2, while maintaining the relationship that R1=R2.

Figure 3:
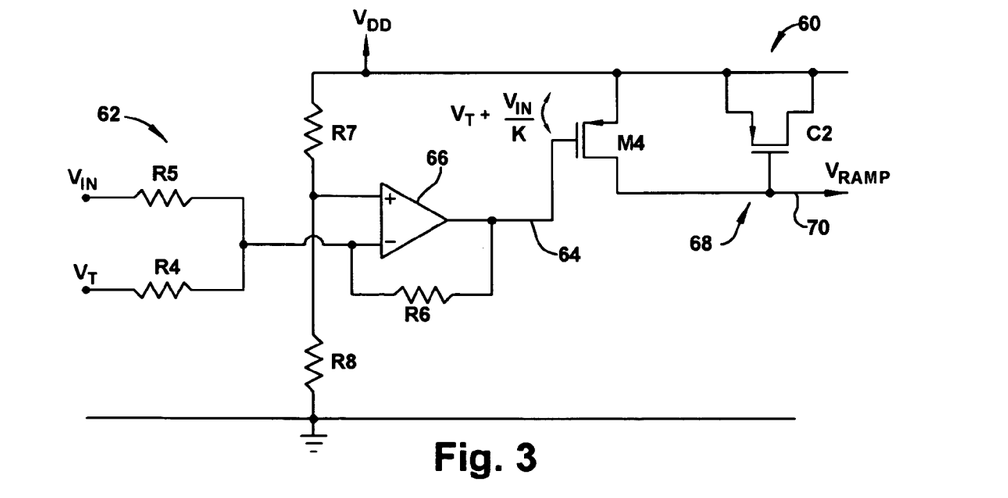
FIG. 3 depicts summing and inversion circuitry that can be employed in a ramp generator according to an aspect of the present invention.

One example of a circuit that can utilize $V_T$ is the circuit 60 depicted in FIG. 3. The circuit 60 generates a ramp signal $V_{RAMP}$ based on an input signal $V_{IN}$ and a $V_T$ signal. The circuit 60 includes a first stage 62 that is configured to perform a summing and inversion of $V_T$ and the input signal $V_{IN}$. $V_T$ is provided relative to electrical ground, such as can be provided by the $V_T$ extraction circuit 50 of FIG. 2. The input signal $V_{IN}$ can be a user-programmable signal that is utilized to control the $V_{RAMP}$ signal. The first stage 62 thus produces an output at 64 corresponding to $$V_T + \frac{V_{IN}}{K}$$

relative to $V_{DD}$, where K is a positive real number corresponding to circuit parameters, such as described herein In the example of FIG. 3, the first stage 62 includes an op-amp 66 that is configured to perform the summation and inversion of $V_T+V_{IN}$ relative to the non-inverting input of the op-amp 66. $V_T$ is coupled to the inverting input of the op-amp 66 through a resistor R4 and $V_{IN}$ is coupled to the inverting input through a resistor R5. The output 64 of the op-amp 66 is coupled to the inverting input through a resistor R6 to provided negative feedback. In one example, R4=R6 and R5=K·R4, where K is a real number. The value of K can be selected by configuring R4, R5 and R6 to define the proportional amount of $V_{IN}$ provided at the output 64. For example, if R5=R4, then K=1. The non-inverting input of the op-amp 66 is coupled to receive a reference voltage intermediate $V_{DD}$ and electrical ground. For instance, the reference voltage can be produced by voltage divider of resistors R7 and R8 connected in series between $V_{DD}$ and electrical ground in which the node between resistors R7 and R8 is coupled to the non-inverting input. Thus, the reference voltage can be established based on the ratio of R7 and R8. For purposes of the following example, it is assumed that R7=R8.

The output signal $$V_T + \frac{V_{IN}}{K}$$

(relative to $V_{DD}$) is provided as an input to an output stage 68. In particular, the $$V_T + \frac{V_{IN}}{K}$$

signal is provided to the gate of a MOS transistor M4. Since the source of the MOS transistor M4 is coupled to $V_{DD}$, the gate-to-source voltage of the transistor M4 ($V_{GS4}$) corresponds to $$V_{GS4} = V_T + \frac{V_{IN}}{K}.$$

A capacitor C2 is coupled in parallel with M4 between $V_{DD}$ and an output node 70. The capacitor C2 is configured as the gate capacitance of a MOS transistor by shorting the source and drain of the MOS transistor to $V_{DD}$. By supplying $$V_T + \frac{V_{IN}}{K}$$

to the gate of M4, the capacitor C2 integrates the drain current through M4 to provide the ramp signal $V_{RAMP}$. With reference to Eq. 1 for drain current of a MOS transistor, saturation of the device can be maintained for larger values of the ramp signal $V_{RAMP}$ if $V_{GS4}-V_T$ is much less than $V_{DD}$. Thus, the value of K can be selected to maintain saturation and, in turn, produce a desired ramp signal $V_{RAMP}$ at 70. Additionally, as described above with respect to Eq. 4, the slope of the ramp signal $V_{RAMP}$ corresponds to $$\frac{dV_C}{dt},$$

which varies as a function of the input voltage $V_{IN}$. The ramp signal $V_{RAMP}$ thus can be generated with reduced process sensitivity since process-dependent parameters ($V_T$) have been reduced in the drain current that is utilized to charge the capacitor C2. Additionally, Cox effects in the capacitor C2 substantially cancel the $C_{OX}$ effects in the drain current.

Figure 4:
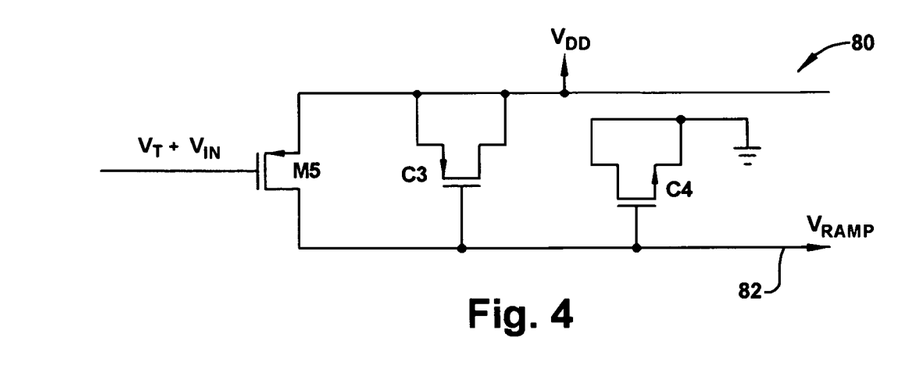
FIG. 4 depicts an example of an alternative output stage that can be utilized in a ramp generator according to an aspect of the present invention.

An alternative example of an output stage 80 that can be employed to generate a ramp signal $V_{RAMP}$ is depicted in FIG. 4. In this example, a MOS transistor M5 is connected between a positive supply rail, indicated at $V_{DD}$, and an output 82 corresponding to the ramp signal $V_{RAMP}$. The MOS transistor M5 receives a control input signal of $$V_T + \frac{V_{IN}}{K}$$

(relative to $V_{DD}$) at its gate, such that the drain current in saturation can be approximated by Eq. 2. A pair of capacitors C3 and C4 is connected at the output 82. Each of the capacitors C3 and C4 is formed from a different type of corresponding MOS device. For example, one of the capacitors C3 is formed from a p-channel MOS transistor with its source and drain shorted to $V_{DD}$ and C4 is formed from an n-channel MOS transistor with its source and drain shorted to electrical ground. By connecting the capacitors C3 and C4 at the output 82, the respective capacitors C3 and C4 can be sized so that the resulting ramp signal $V_{RAMP}$ can be generated with improved linearity. As described herein, the process dependent parameters associated with the threshold voltage are mitigated from the drain current such that the resulting ramp signal is also substantially independent of such process dependencies.

Figure 5:
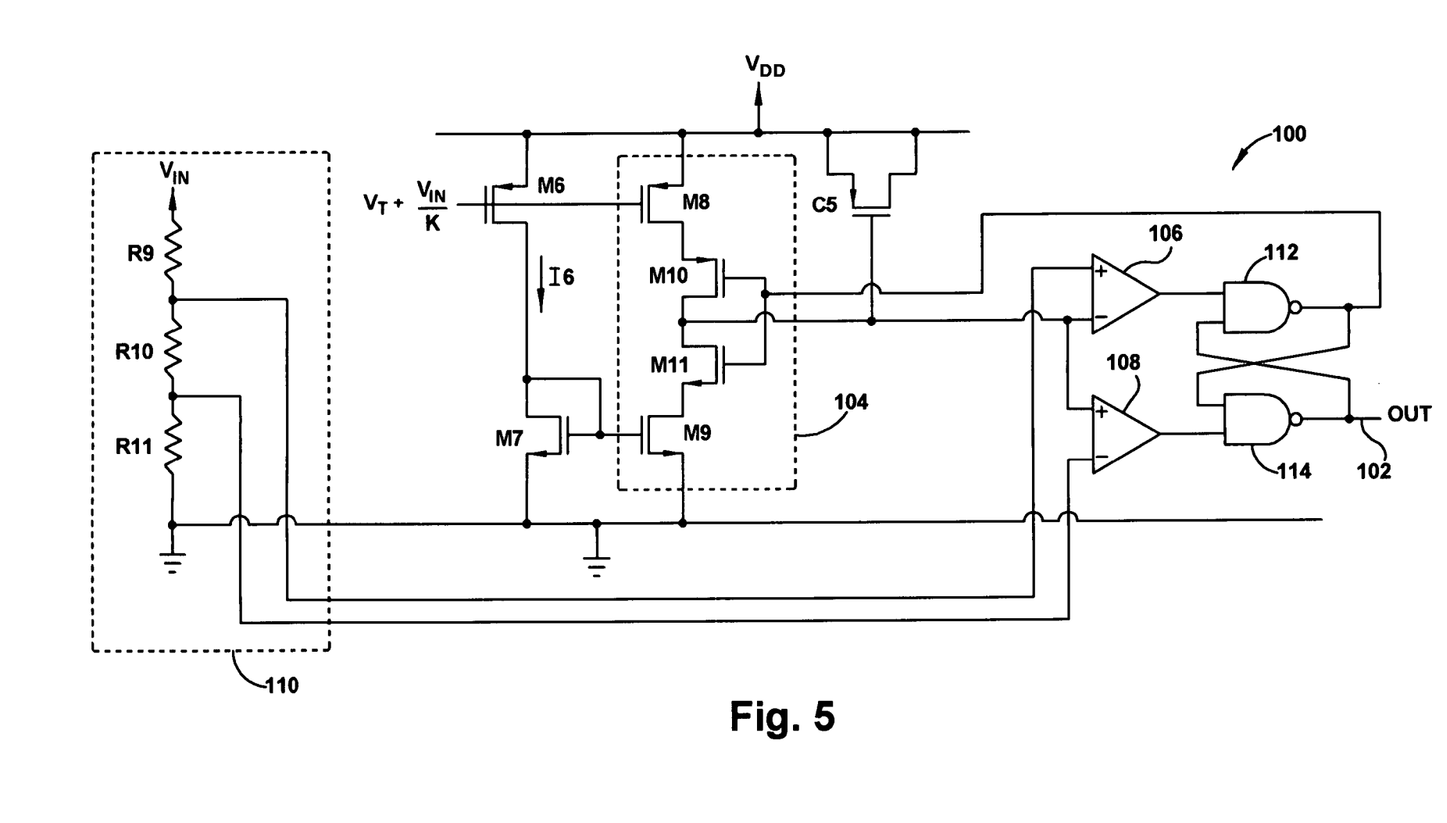
FIG. 5 depicts an example of an oscillator that can be implemented according to an aspect of the present invention.

FIG. 5 depicts an example of a voltage controlled oscillator 100 that can be implemented to generate an oscillating output signal (OUT) at an output 102 that is substantially independent of many process-dependent MOS transistor parameters. The oscillating output signal OUT, for example, may be a sine waveform, a square waveform, a saw tooth waveform to name a few types of oscillating waveforms. The oscillator 100 includes an input MOS transistor M6 coupled between a positive supply rail, indicated at $V_{DD}$. The gate of the MOS transistor M6 receives an input signal $$V_T + \frac{V_{IN}}{K}$$

(relative to $V_{DD}$) at its gate to generate a corresponding drain current I6, such as can be approximated by Eq. 2 mentioned above. The drain current I6 is utilized as a source current for biasing other circuitry in the oscillator 100 to provide for process-independent operation and generation of the oscillating output signal OUT at 102.

The current I6 is provided to diode connected MOS transistor M7, which is connected between M6 and electrical ground. The gates of each of the MOS transistors M6 and M7 are connected to mirror current for an associated charge pump system 104. In particular, the gates of each of the MOS transistors M6 and M7 are connected to the gates of MOS transistors M8 and M9, respectively. The MOS transistors M8 and M9 are connected to supply current for charge pump MOS transistors M10 and M11, which are connected in series between transistors M8 and M9. In the example of FIG. 5, the high-side MOS transistor M10 is a p-channel device and the low-side MOS transistor is an n-channel device. The node between MOS transistors M10 and M11 is coupled to a gate capacitor C5 formed from another MOS transistor. Thus, operation of the MOS transistors M10 and M11 can be controlled to repeatedly charge and discharge the capacitor C5. The sizes of the transistors M8 and M9 can be configured relative to transistors M6 and M7, respectively, to control the amount of current that is delivered to the charge pump transistors M10 and M11.

The voltage across the capacitor C5 is provided as an input to comparators 106 and 108. A threshold generator 110 is connected to provide the other inputs of the comparators 106 and 108. The threshold voltages are set to define the upper and lower limits of the voltage signal across the capacitor C5. The upper threshold is provided to a non-inverting input of the comparator 106 and the lower threshold is provided to an inverting input of the comparator 108.

In the example of FIG. 5, the threshold generator 110 is formed as a voltage divider that includes resistors R9, R10 and R11 connected between $V_{IN}$ and electrical ground. The values of R9, R10 and R11 can be selected to set the capacitor voltage limits (comparator thresholds) as a function of $V_{IN}$. As an example, the oscillator frequency can be linearly dependent on $V_{IN}$ (instead of $V_{IN}^2$ by making the $V_{RAMP}$ range (e.g., the difference between the comparator thresholds) proportional to $V_{IN}$. For instance, the $V_{RAMP}$ signal is a triangular waveform with slopes depending on the charge pump current, which is proportional to $V_{IN}^2$. The amplitude of the $V_{RAMP}$ signal depends on the difference between comparator threshold voltages, which (in this example) is proportional to $V_{IN}$. As a result, the frequency of the $V_{RAMP}$ signal is linearly dependent on $V_{IN}$. As one example, R9=R10=R11, such that the upper and lower threshold limits correspond to $\frac{2}{3}V_{IN}$ and $\frac{1}{3}V_{IN}$.

Each of the comparators 106, 108 provide corresponding output signals to inputs of respective NAND gates 112 and 114. The output of each of the NAND gates 112 and 114 is fed as an input to each of the other NAND gates. The oscillating output signal OUT is provided at 102 as the output of the NAND gate 114. The output of the other NAND gate 112 is provided as a control input to the respective MOS transistors M10 and M11 to control the direction of current flow relative to the capacitor C5. For example, when the output of the NAND gate is high the NMOS transistor M11 is activated so that the current established through M9 (via the current mirror) is sunk from the capacitor C5 so that the voltage on the capacitor charges toward electrical ground accordingly. When the output of the NAND gate is low, the MOS transistor M10 is activated so that the current established through M8 (via the current mirror) is sourced to charge the capacitor gate toward $V_{DD}$. The operation of the M10 and M11 thus switches periodically based on the voltage across the capacitor relative to the capacitor voltage limits (e.g., thresholds) provided by the threshold generator 110. The frequency of the oscillating output signal OUT will vary depending on the $$\frac{V_{IN}}{K}$$

component of the input to the oscillator 100 (see, e.g., Eq. 4 above) as well as on the voltage limits provided by the threshold generator 110. As mentioned above, for example, frequency can be linearly dependent on $V_{IN}$.

Figure 6:
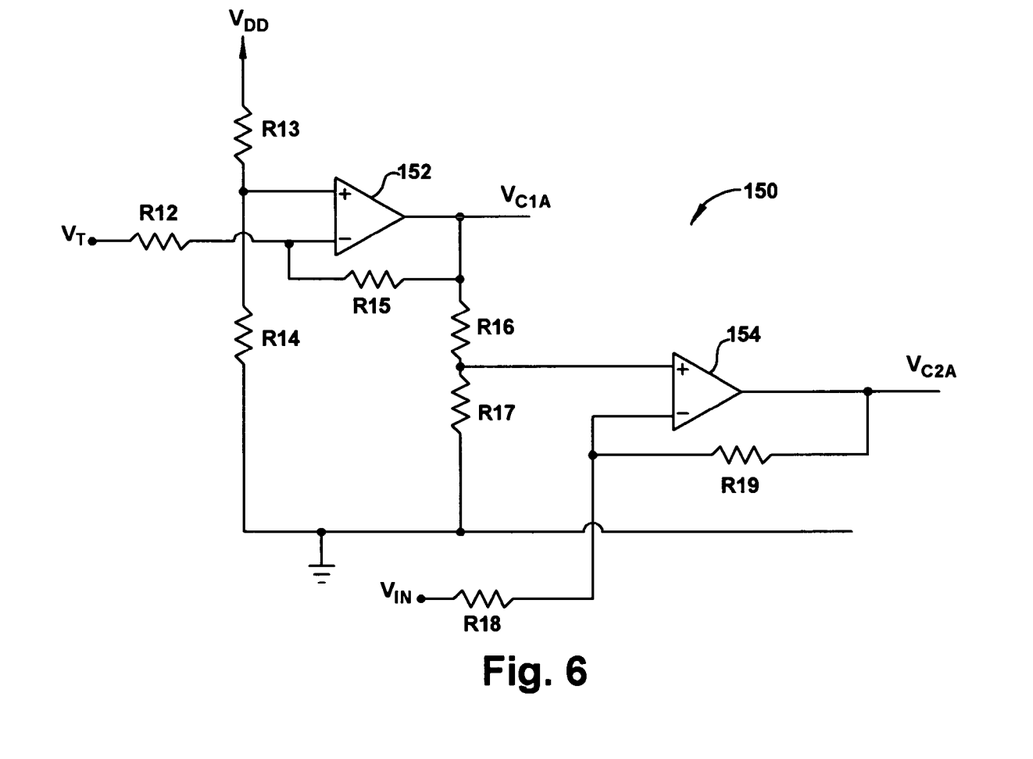
FIG. 6 depicts an example of a circuit that can be employed to generate capacitor limit voltages for use in an oscillator according to an aspect of the present invention.

As mentioned above, the capacitor voltage limits for the capacitor voltage can be generated in various ways. Another approach that can be utilized to generate capacitor voltage limits for the oscillator is depicted in FIG. 6. The approach in FIG. 6 is one additional example of a circuit 150 that can be implemented to derive the capacitor voltage limits as a function of $V_{IN}$ and $V_T$. By deriving the capacitor voltage limits from both $V_{IN}$ and $V_T$, non-linearities in the voltage-to-frequency transfer function can be reduced. Additionally, such an approach further mitigates process-dependent variations.

The circuit 150 includes a pair of op-amps 152 and 154 that provide respective capacitor voltage limits $V_{C1A}$ and $V_{C2A}$, where $V_{C1A}$ corresponds to an upper limit and $V_{C2A}$ corresponds to a lower limit. A threshold voltage $V_T$, such as provided from a threshold voltage extractor, as described herein, is provided to an inverting input of the op-amp 152 through a resistor R12. A voltage divider provides a voltage to the non-inverting input of the op-amp 152. The voltage divider is formed of resistors R13 and R14 connected in series between $V_{DD}$ and electrical ground, such that the resistance values of the resistors R13 and R14 define the input reference voltage at the non-inverting input. A negative feedback resistor is connected between the output of the op-amp 152 and the inverting input. The values of R12, R13, R14 and R15 can be selected to mitigate non-linearities associated with the voltage-to-frequency transfer function and variations in the threshold voltage $V_T$.

The first capacitor voltage limit $V_{C1A}$ is utilized to establish a reference voltage for the non-inverting input of the second op-amp 154. The first capacitor voltage limit $V_{C1A}$ provides the upper rail for a voltage divider formed of resistors R16 and R17 connected between $V_{C1A}$ and electrical ground. The inverting input of the op-amp 154 corresponds to $V_{IN}$, which is provided through an input resistor R18. A feedback resistor R19 is connected between the output of the op-amp 154 and the inverting input to provide the second capacitor voltage limit $V_{C2A}$.

Linearity and process-dependencies can be reduced since the voltage limits are generated as a function the same threshold voltage and input voltage that are applied to generate the ramp signal with the MOS capacitor. Those skilled in the art will understand and appreciate other approaches that may be implemented to derive voltage limits for the capacitor voltage (e.g., by correlating the threshold limits to $V_T$) so as to mitigate frequency variations due to process variations.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, while the particular examples shown and described herein generated $V_T$ for a p-channel MOS transistor, the approaches and concepts described herein are equally applicable to N-channel MOS transistors. Accordingly, the present invention is intended to embrace all such alterations, modifications, and variations that fall within the spirit and scope of the appended claims.

What is claimed is:

1. A system for providing a threshold voltage ($V_T$), comprising:
 a $V_T$ extractor that extracts the $V_T$ for a metal oxide semiconductor (MOS) transistor relative to a first voltage rail; and
 an inversion circuit that inverts the extracted $V_T$ relative to a reference voltage that is intermediate the first voltage rail and a second voltage rail, the inversion circuit providing an output corresponding to the $V_T$ relative to the second voltage rail, wherein the inversion circuit further comprises summing circuitry to add an input voltage to the $V_T$ such that the output is provided as a voltage potential of the input voltage plus the $V_T$ relative to the second voltage rail.

2. The system of claim 1, wherein the MOS transistor is a first MOS transistor, and the $V_T$ extractor further comprises:
 the first MOS transistor being connected between a current source and the first voltage rail, the current source establishing a first current through the first MOS transistor;
 a second MOS transistor connected with the first voltage rail, the second MOS transistor being coupled with the first MOS transistor;
 a second current, which is proportional to the first current, being mirrored through the second MOS transistor; and
 an amplifier coupled to receive a first input corresponding to the gate-to-source voltage of the first MOS transistor and a second input corresponding to a difference between the gate-to-source voltage of the second MOS transistor and the gate-to-source voltage of the first MOS transistor, the amplifier being configured to provide a voltage at an amplifier output corresponding to the $V_T$ relative to the first voltage rail.

3. The system of claim 2, wherein the first and second currents are substantially equal.

4. The system of claim 2, further comprising:
 a first resistor connected between the current source and the first MOS transistor, the first input of the amplifier connected to a node between the first resistor and the first MOS transistor;

a second resistor connected between the second MOS transistor and the second input of the amplifier; and
a third resistor connected between the second input of the amplifier and the amplifier output, the first, second and third resistors being configured such that the voltage across the second resistor is substantially equal to the voltage across the first resistor.

5. The system of claim 1, wherein the inversion circuit further comprises:
an amplifier having first and second inputs, the first input receiving the reference voltage, the second input receiving a voltage proportional to an input voltage ($V_{IN}$) plus the $V_T$ relative to the first voltage rail, the amplifier providing a voltage at an output of the amplifier corresponding to $$V_T + \frac{V_{IN}}{K}$$

relative to the second voltage rail, where K is a positive real number.

6. The system of claim 5, wherein K varies as a function of a first resistance connected between the second input of the amplifier circuit and $V_{IN}$ and a second resistance connected between the second input of the amplifier circuit and the output of the amplifier.

7. The system of claim 5, wherein the MOS transistor is a first MOS transistor, the system further comprising a second MOS transistor configured as a capacitor connected between the second voltage rail and an output to provide a ramp signal at the output having a voltage ($V_C$) having a $$\frac{dV_C}{dt}$$

characteristic that is functionally related to $V_{IN}$.

8. The system of claim 7, further comprising a third MOS transistor having a gate coupled to the amplifier output to receive the $$V_T + \frac{V_{IN}}{K},$$

the third MOS transistor being connected across the capacitor between the second rail and the output.

9. The system of claim 7, further comprising a current mirror network that mirrors the current through a third MOS transistor to provide a corresponding drain current through the third MOS transistor, the corresponding drain current being applied to the capacitor to provide the ramp signal.

10. The system of claim 9, further comprising an oscillator configured to provide an oscillating output signal by repeatedly charging and discharging the capacitor between first and second capacitor voltages according to the corresponding drain current, such that the frequency of the oscillating output signal is substantially independent of process variations.

11. The system of claim 10, wherein the first and second capacitor voltages are generated based on the $V_{IN}$, such that the frequency of the oscillating output signal is linearly dependent on the $V_{IN}$.

12. A system for generating a ramp signal that is substantially independent of threshold voltage parameters, comprising:
a $V_T$ extractor that extracts the $V_T$ for a first metal oxide semiconductor (MOS) transistor and provides the $V_T$ relative to a first voltage rail;
an inversion and summation network that receives the $V_T$ relative to the first voltage rail and inverts a summation of the $V_T$ and an input signal ($V_{IN}$) relative to a reference voltage that is intermediate the first voltage rail and a second voltage rail, the inversion and summation network provides an output corresponding to summation of the $V_T$ and the input signal $V_{IN}$ relative to the second voltage rail;
a second MOS transistor configured as a capacitor having a gate capacitance that is connected between the second voltage rail and an output; and
a third MOS transistor that generates a drain current in response to the summation of the $V_T$ and an input signal $V_{IN}$, current that is proportional to the drain current of third MOS transistor being applied to the capacitor such that the capacitor provides a corresponding ramp signal at the output.

13. The system of claim 12, wherein the $V_T$ extractor further comprises:
a fourth MOS transistor connected between a current source and the first voltage rail, the current source establishing a drain current through the fourth MOS transistor;
a fifth MOS transistor connected with the first voltage rail, the fifth MOS transistor being coupled with the fourth MOS transistor;
a corresponding current, which is proportional to the drain current of the fourth MOS transistor, being mirrored through the fifth MOS transistor; and
an amplifier coupled to receive a first input corresponding to the gate-to-source voltage of the fourth MOS transistor and a second input corresponding to a difference between the gate-to-source voltage of the fifth MOS transistor and the gate-to-source voltage of the fourth MOS transistor, the amplifier being configured to provide the $V_T$ relative to the first voltage rail at an output of the amplifier.

14. The system of claim 12, wherein the inversion circuit further comprises:
an amplifier having first and second inputs, the first input receiving the reference voltage, the second input receiving a voltage proportional to the $V_{IN}$ plus the $V_T$ relative to the first voltage rail, the amplifier providing a voltage at an output of the amplifier corresponding to $$V_T + \frac{V_{IN}}{K}$$

relative to the second voltage rail, where K is a positive real number.

15. The system of claim 14, wherein K varies as a function of a first resistance connected between the second input of the amplifier circuit and $V_{IN}$ and a second resistance connected between the second input of the amplifier circuit and the output of the amplifier.

16. The system of claim 12, further comprising:
a current mirror network that mirrors the drain current of the third MOS transistor to a fourth MOS transistor to provide a corresponding drain current through the fourth MOS transistor; and an oscillator configured to provide the ramp signal as an oscillating output signal by repeatedly charging and discharging the capacitor between first and second capacitor voltages, such that the frequency of the oscillating output signal is substantially independent of process variations.

17. The system of claim 16, wherein the first and second capacitor voltages are generated based on the $V_{IN}$, such that the frequency of the oscillating output signal is linearly dependent on the $V_{IN}$.

18. A system for providing a ramp signal with reduced process sensitivity, comprising:

means for extracting a threshold voltage ($V_T$) for a first metal oxide semiconductor (MOS) transistor and for providing the $V_T$ relative to a first voltage rail;

means for summing the $V_T$ relative to the first voltage rail and an input signal $V_{IN}$ to provide a summation of $$V_T + \frac{V_{IN}}{K},$$

where K is a positive real number;

means for inverting the summation of $$V_T + \frac{V_{IN}}{K}$$

relative to a reference voltage that is intermediate the first voltage rail and a second voltage rail and for providing the summation of $$V_T + \frac{V_{IN}}{K}$$

relative to the second voltage rail; and means for generating a current through a second MOS transistor as a function of the summation of the $$V_T + \frac{V_{IN}}{K}$$

relative to the second voltage rail.

19. The system of claim 18, further comprising means for generating a ramp signal in response to the current through the second MOS transistor.

20. The system of claim 19, further comprising:

means for mirroring the current through the second MOS transistor to a third MOS transistor to provide a corresponding drain current through the third MOS transistor; and means for repeatedly charging and discharging the means for generating a ramp signal between first and second limit voltages to provide an oscillating output signal having a frequency that is substantially independent of process variations.

21. The system of claim 19, wherein the means for generating a ramp signal further comprises a third MOS transistor configured as a capacitor connected between the second voltage rail and an output at which the ramp signal is provided.

* * * * *